US007446289B2

(12) United States Patent
Staton et al.

(10) Patent No.: US 7,446,289 B2
(45) Date of Patent: Nov. 4, 2008

(54) ENHANCED PLASMA FILTER

(76) Inventors: Vernon E. Staton, 240 Forge Hill La., Lexington, VA (US) 24450; Jeremy C. Cheron, 1467 S. Highview La., Alexandria, VA (US) 22311; Soorena Sadri, 1467 S. Highview La., Alexandria, VA (US) 22311

( * ) Notice: Subject to any disclaimer, the term of this patent is extended or adjusted under 35 U.S.C. 154(b) by 0 days.

(21) Appl. No.: 11/595,948

(22) Filed: Nov. 13, 2006

(65) Prior Publication Data

US 2007/0119825 A1 May 31, 2007

Related U.S. Application Data

(60) Provisional application No. 60/735,217, filed on Nov. 10, 2005.

(51) Int. Cl.
*H05B 6/36* (2006.01)
*H01L 21/00* (2006.01)

(52) U.S. Cl. ............ 219/672; 219/121.36; 219/121.59; 156/345.28

(58) Field of Classification Search ............ 219/121.36, 219/121.48, 672, 670, 618, 121.5, 121.59; 315/111.21, 111.51; 333/17.3, 32, 99 PL; 264/192.12, 298.02; 156/345.28
See application file for complete search history.

(56) References Cited

U.S. PATENT DOCUMENTS 4,123,316 A * 10/1978 Tsuchimoto ................ 438/731
5,288,969 A * 2/1994 Wong et al. ............ 219/121.52
5,567,268 A * 10/1996 Kadomura ............ 156/345.28
5,585,766 A * 12/1996 Shel .......................... 333/17.3
5,762,750 A * 6/1998 Chen et al. ............. 156/345.28

OTHER PUBLICATIONS

International Search Report and Written Opinion, International Application No. PCT/US2006/043941, mailed Aug. 6, 2007.

* cited by examiner

*Primary Examiner*—Quang T Van
(74) *Attorney, Agent, or Firm*—Stuart I. Smith, Esq.

(57) ABSTRACT

A device is provided for adiabatically compressing a plasma stream and maintaining the plasma stream in the compressed state. The device has a plasma compression region; a first plurality of electromagnets positioned around the plasma compression region for compressing the plasma stream; a reaction region positioned down stream from the plasma compression region; and a second plurality of electromagnets positioned around the reaction region for maintaining the plasma stream in its compressed state.

19 Claims, 4 Drawing Sheets

ENHANCED PLASMA FILTER

This application claims priority to U.S. Provisional Patent Application No. 60/735,217, filed Nov. 10, 2005, which is incorporated by reference herein in its entirety.

BACKGROUND OF THE INVENTION

The invention relates to plasma creation. In particular, embodiments of the invention relate to the compression of plasma to increase the temperature of the plasma.

SUMMARY OF THE INVENTION

Embodiments of the invention provide a device for adiabatically compressing a plasma stream and maintaining the plasma stream in the compressed state. The device has a plasma compression region; a first plurality of electromagnets positioned around the plasma compression region for compressing the plasma stream; a reaction region positioned down stream from the plasma compression region; and a second plurality of electromagnets positioned around the reaction region for maintaining the plasma stream in its compressed state.

Other embodiments of the invention provide a method of adiabatically compressing a plasma stream and maintaining the plasma stream in the compressed state. The method includes providing a plasma compression region; positioning a first plurality of electromagnets around the plasma compression region; compressing the plasma stream with the first plurality of electromagnets; providing a reaction region positioned down stream from the plasma compression region; positioning a second plurality of electromagnets around the reaction region; and maintaining the plasma stream in its compressed state with the second plurality of electromagnets.

BRIEF DESCRIPTION OF THE DRAWINGS

The invention is explained below in further detail with the aid of exemplary embodiments shown in the drawings, wherein.

DETAILED DESCRIPTION OF THE INVENTION

The invention is explained in the following with the aid of the drawings in which like reference numbers represent like elements.

Particular embodiments of the invention can be used to clean, filter and/or process waste, either solid or liquid waste, by high end plasma creation. Allowing for heat generation and/or the conversion of the fed waste material into hydrogen or other fuel sources by a down stream gasification and processing process based on standard chemical engineering methods.

Examples of particular embodiments of the invention use an electric device (for example, electrodes) to turn a safe clean abundant gas into a plasma. The plasma is immediately moved into an area where a specially designed combination of electromagnets squeeze the plasma to a higher temperature and contain it over a longer distance than what would normally be expected by the electric device alone. At some point over that distance, waste is injected into the chamber and interacts with the plasma. As the plasma travels along the chamber's axis, the momentum, pressure and temperature of the plasma breaks up the waste. As the waste breaks up, a vacuum system and heat exchanger separates the leftover materials into groups where they can be scrubbed, filtered, processed, converted to a fuel or secondary product and/or reused. For a minimal input power, an initial plasma of a few thousand degrees Kelvin over a few inches can be generated. With the extra configuration of magnetic fields it is estimated that this initial plasma temperature can be raised to several hundred thousand degrees Kelvin for a few feet or more. This temperature and distance should be large enough to process large amounts of waste water per day, and reduce dangerous compounds down to fairly stable and safe components.

Plasma heating by adiabatic compression is used in fusion research. The invention solves the problems of plasma instability by using a special magnetic configuration. This configuration also allows greater field strengths for very little to no increases in power, which greatly increases plasma temperature, density and momentum compared to previous designs. In addition to enhanced stability and increased temperature for roughly the same power, the invention's field configuration also creates a "magnetic nozzle" which keeps the plasma confined and directed efficiently for a longer time after it leaves the main magnetic field, keeping its momentum and temperature better directed at the target (this would also help efficiency in space flight applications).

The enhanced plasma system uses adiabatic compression to raise plasma temperature and density, and focus it into a channel where it can break-up medical or other waste. The plasma temperature can be controlled between an estimated 20,000 and 1 million degrees Kelvin depending on the operational requirements and design choice of the system. The momentum and density of the plasma can also be controlled based on the operation and design.

Figure 1:
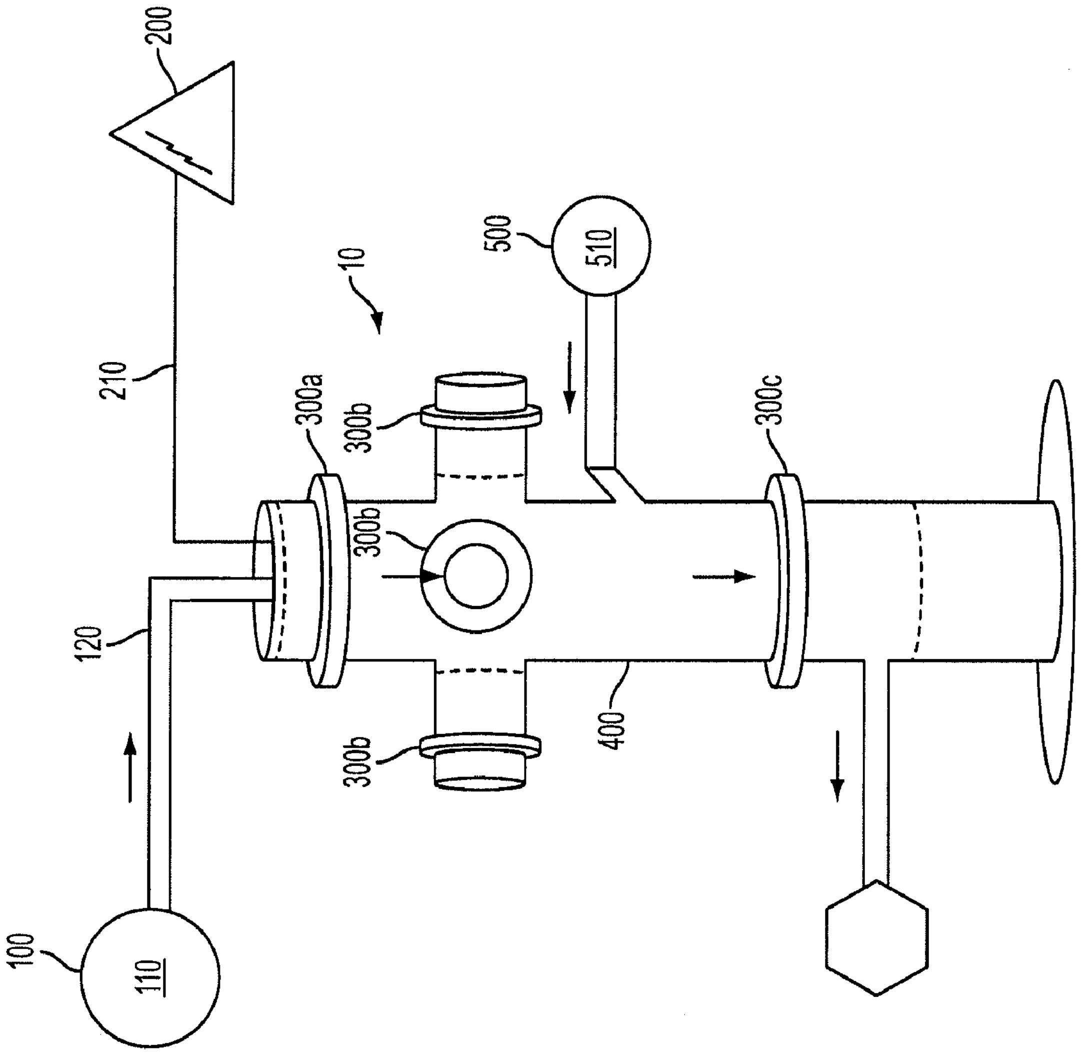
FIG. 1 is a side view of an example of a plasma device in accordance with an embodiment of the invention.

Examples of the invention break the waste material into two or more categories and turn them into a slurry or solid waste deposit depending on their composition and make up. As shown in FIG. 1, the waste 510 is then injected through a waste introduction device 500 into the reaction chamber, through which the plasma jet will travel. The plasma jet will heat the waste up to the required temperature causing the compounds to break up and many of the atoms to ionize. Ionization will depend on the atomic number, and composition breakup will depend on the material and temperature. At the temperatures used in the invention, all compositions should easily break up and most of the atoms should ionize. If the material is tougher, the temperature can be raised and/or the plasma jet narrowed to add its momentum to breaking up the compounds. It is noted that not much exists that will not be turned into a gas of individual atoms at temperatures approaching one million degrees Kelvin.

The invention provides no possibility of nuclear fission or fusion, so there is no chance of atomic explosion. The atoms that are ionized will, when cooled, simply require their electrons. The compounds, as a gas of individual atoms will proceed to a series of cooling and filtering by standard means of HEPA filters, HEME filters, scrubbers and mass/density separators. Radioactive materials, like cesium, may come out of the filter radioactive so those types of materials will have to be separated and continue to be disposed of by the federal, state and local measures already in place.

The invention is more efficient than previous methods and allows greater stability and higher temperatures to be generated.

Figure 2:
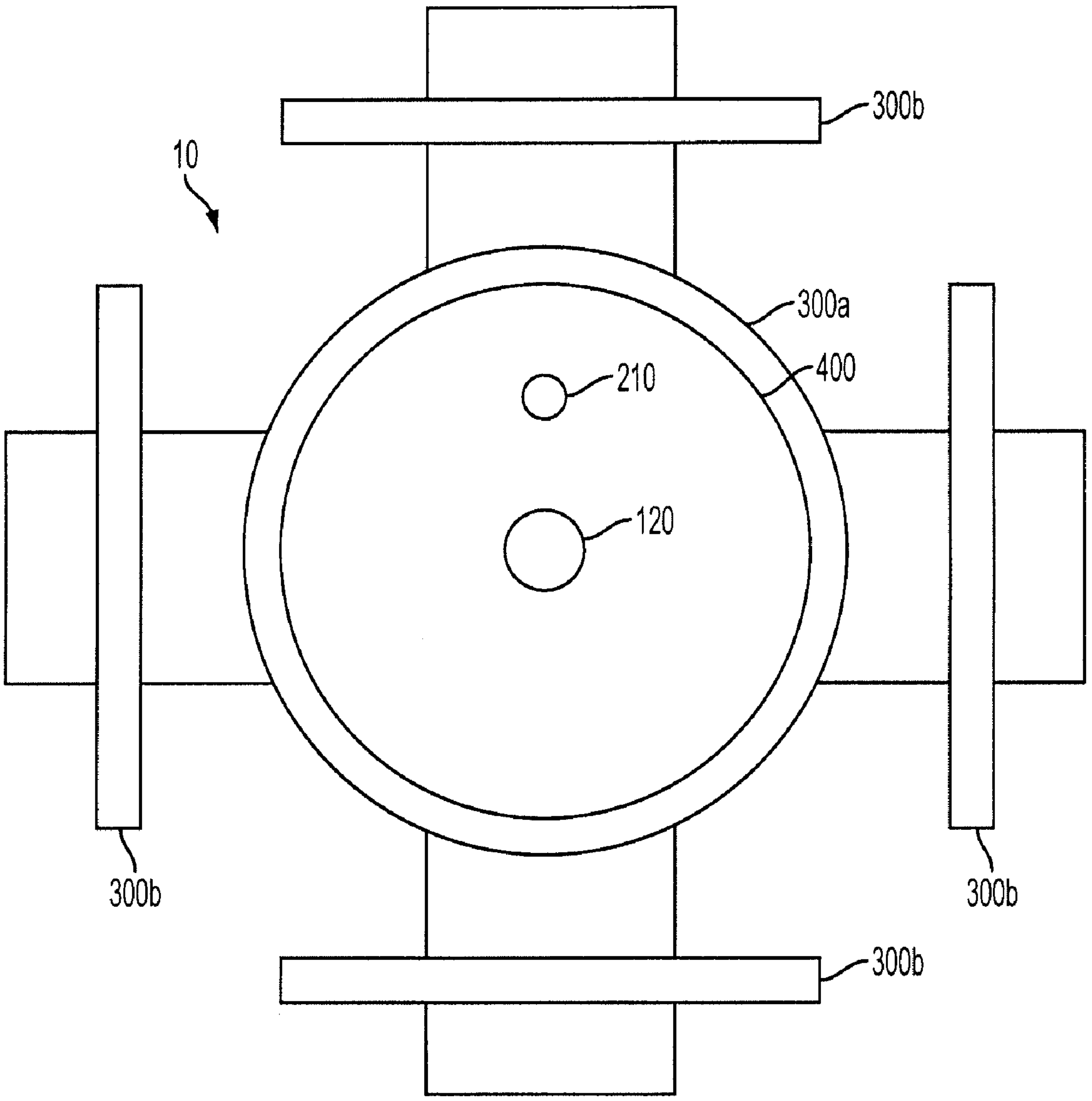
FIG. 2 is a top view of the device shown in FIG. 1.

FIG. 1 shows an example of a plasma filter device 10 in accordance with the invention. Plasma filter device 10 is connected to a reactant gas supply 100 that supplies a reactant gas 110 to plasma filter device 10 through a supply pipe 120. A pulsating high voltage system 200 supplies power to plasma filter device 10 through supply line 210. FIG. 2 shows a top view of plasma filter device 10.

Figure 3:
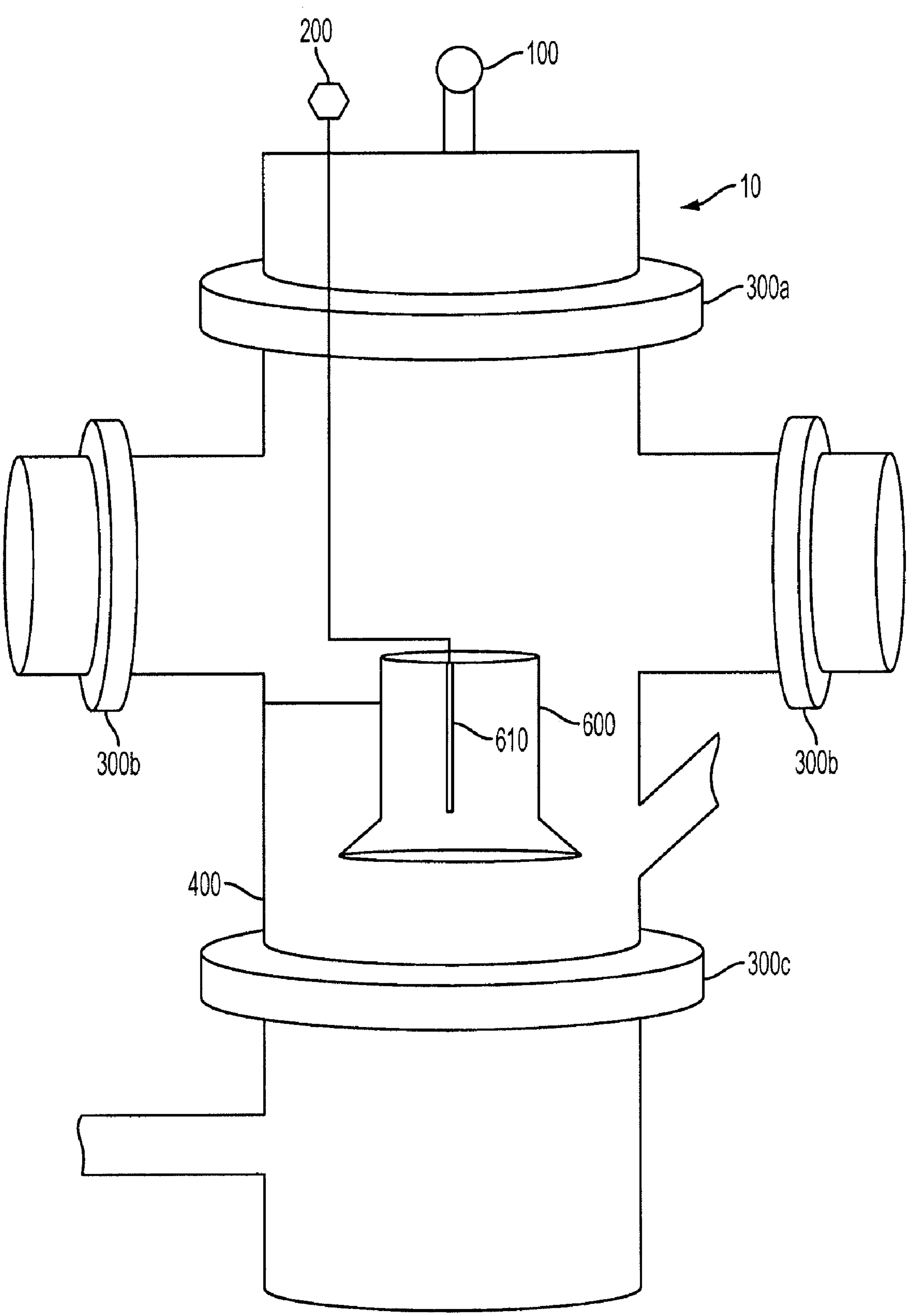
FIG. 3 is a partial view including portions of the interior of the device shown in FIGS. 1 and 2.

Reactant gas 110 is converted to plasma before it enters scrubber chamber 400 by plasma generation means such as plasma torches, electrode arrays, helicon antennas and many other methods. Surrounding the plasma generation device is the system of magnets 300*a*, 300*b*, and 300*c* that will compress and maintain the plasma to high temperatures and densities. FIG. 3 is a partial view of plasma filter device 10 in which portions of the interior of plasma filter device 10 are shown. Immediately prior to scrubber chamber 400 in the path of plasma flow, the plasma passes through an anode shell 600 which can be, for example, tungsten or aluminum. A cathode rod 610 is positioned with anode shell 600. Cathode rod 610 can be, for example, tungsten.

Figure 4:
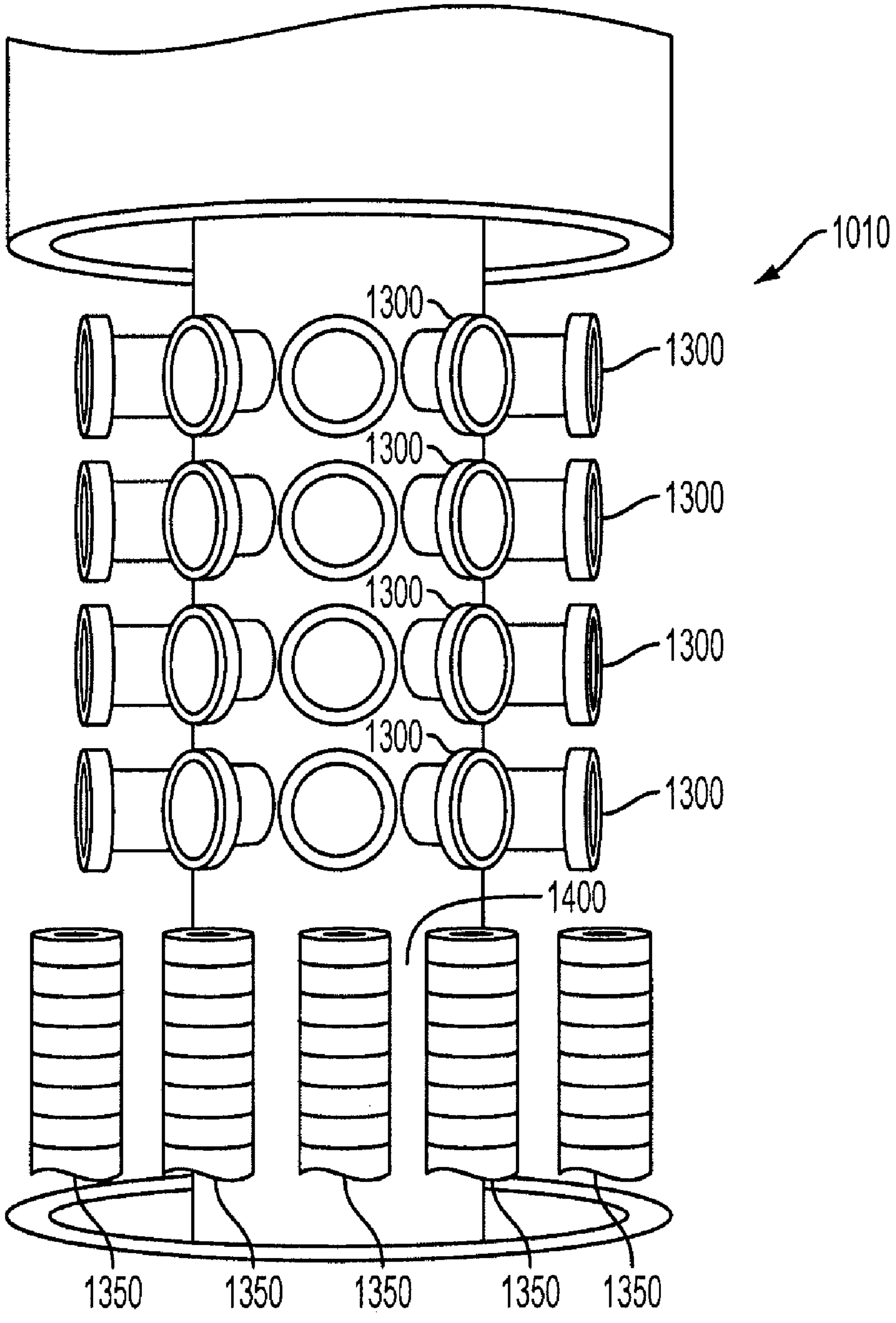
FIG. 4 is a partial view of a second example of an embodiment of the invention.

FIG. 4 shows another example of a plasma filter device 1010. Plasma filter device 1010 has two arrays of magnets oriented differently relative to scrubber chamber 1400. When the gas enters the cathode/anode (as an example, but several methods for generating plasmas like helicon antennas and plasma torches can be used) an intense electric field generated between the anode and cathode causes the reactant gas (for example, hydrogen, argon, or oxygen) to become stripped of its electrons and form a plasma (this can involve a single plasma generation device or an array of them, power by conventional means or by an advanced tank circuit or high power system, to produced a large area plasma). At this stage a series of electromagnets 1300 positioned around the plasma and in certain order causes the plasma to be squeezed to a higher temperature. The plasma filter device 1010 shows multiple layers or magnets 1300 several segments long with flipped magnets 1350 acting as a channel to maintain the plasma stream in the compressed state. An example of the invention that was modeled had 20 circumferential sets of magnets, each circumferential set having 36 magnets (represented by reference number 1300 in FIG. 4). These magnets 1300 progressively compress the plasma stream into a more and more compressed stream as the plasma stream moves through the chamber. Below (in the example shown in FIG. 4) the array of magnets 1300, the array of magnets 1350 are positioned in 36 columns of 10 magnets each. In this example, magnets 1350 are positioned such that they are rotated 90 degreed relative to magnets 1300. The magnets can be made of superconducting materials like, for example, Neodymium or plain conductors like, for example, copper and can be stand alone or cooled by, for example, air, water or liquid nitrogen.

The effect that has been modeled and tested is to increase the flux though a constant area that will increase the regional magnetic field. As the magnetic field enclosing the plasma is increased the plasma is adiabatically compressed and the temperature increased. Various configurations and combinations of magnets can be used to focus more magnetic flux in a constant area to increase magnetic field strength for less current and use that increased magnetic field strength to adiabatically compress the initial plasma to higher densities and temperatures.

Although waste treatment has been used as an example to describe the invention, the invention can also be used to cut and melt steel; heat and clean water; heat and clean air or other gases; produce gases such as, for example, hydrogen an other combustible gases; produce heat; provide propulsion; and to destroy equipment and other materials. It is also noted that theta or other magnetic pinch configurations can be used. In addition, helicon antenna, plasma torches or electric arcs can be used to generate the pre-ionized gas. The electromagnets can be non-linear, non magnetic mirror electromagnetic coils.

The invention has been described in detail with respect to preferred embodiments and it will now be apparent from the foregoing to those skilled in the art that changes and modifications may be made without departing from the invention in its broader aspects. The invention, therefore, is intended to cover all such changes and modifications that fall within the true spirit of the invention.

What is claimed is:

1. A device for adiabatically compressing a plasma stream and maintaining the plasma stream in the compressed state, the device comprising:

a plasma compression region;

a first group of one or more electromagnets positioned around the plasma compression region for compressing the plasma stream, wherein each electromagnet has a first axis perpendicular to a diameter of the electromagnet, and wherein the first axis of each electromagnet of the first group of electromagnets is directed substantially perpendicular to the direction of flow of the plasma stream;

a reaction region positioned down stream from the plasma compression region; and a second group of one or more electromagnets positioned around the reaction region for maintaining the plasma stream in its compressed state.

2. The device of claim 1, wherein the first group of electromagnets are non-linear electromagnetic coils.

3. The device of claim 2, wherein the second group of electromagnets are non-linear electromagnetic coils.

4. The device of claim 3, wherein the first axis of each electromagnet of the first group of electromagnetic coils is directed substantially perpendicular to the direction of flow of the plasma stream.

5. The device of claim 4, wherein the first axis of each electromagnet of the second group of electromagnetic coils is directed substantially parallel to the direction of flow of the plasma stream.

6. The device of claim 5, further comprising a waste introduction device for introducing waste to be processed into the reaction region, wherein the reaction region is adapted to contain the waste and the plasma stream in its compressed state such that the plasma heats the waste and breaks down the waste.

7. The device of claim 6, wherein the reaction region is contained in a reaction chamber.

8. The device of claim 5, further comprising a material introduction device for introducing material to be heated and cleaned into the reaction region, wherein the reaction region is adapted to contain the material and the plasma stream in its compressed state such that the plasma heats and cleans the material.

9. The device of claim 8, wherein the reaction region is contained in a reaction chamber.

10. The device of claim 1, wherein the second group of electromagnets are non-linear electromagnetic coils.

11. The device of claim 1, wherein the first axis of each electromagnet of the second group of electromagnets is directed substantially parallel to the direction of flow of the plasma stream.

12. The device of claim 1, further comprising a waste introduction device for introducing waste to be processed into the reaction region, wherein the reaction region is adapted to contain the waste and the plasma stream in its compressed state such that the plasma heats the waste and breaks down the waste.

13. The device of claim 12, wherein the reaction region is contained in a reaction chamber.

14. A method of adiabatically compressing a plasma stream and maintaining the plasma stream in the compressed state, the method comprising:

providing a plasma compression region;

positioning a first group of one or more electromagnets around the plasma compression region, wherein each electromagnet has a first axis perpendicular to a diameter of the electromagnet, and wherein the first axis of each electromagnet of the first group of electromagnets is directed substantially perpendicular to the direction of flow of the plasma stream;

compressing the plasma stream with the first group of electromagnets;

providing a reaction region positioned down stream from the plasma compression region;

positioning a second group of one or more electromagnets around the reaction region; and maintaining the plasma stream in its compressed state with the second group of electromagnets.

15. The method of claim 14, wherein each of the first group of electromagnets are electromagnetic coils, and each of the second group of electromagnets are electromagnetic coils and the first axis of each electromagnet of the second group of electromagnetic coils is directed substantially parallel to the direction of flow of the plasma stream.

16. The method of claim 14, further comprising introducing waste to be processed into the reaction region, wherein the waste and the plasma stream in its compressed state are contained in the reaction region such that the plasma heats the waste and breaks down the waste.

17. The method of claim 14, further comprising introducing material to be heated and cleaned into the reaction region, wherein the material and the plasma stream in its compressed state are contained in the reaction region such that the plasma heats and cleans the material.

18. The method of claim 14, wherein the method provides propulsion.

19. The method of claim 14, wherein the compressed plasma stream is used to destroy a material.

* * * * *